(12) United States Patent
Baddour et al.

(10) Patent No.: US 6,685,033 B1
(45) Date of Patent: Feb. 3, 2004

(54) SYSTEM AND APPARATUS ENABLING TOP, FRONT AND REAR ACCESS TO A RACK MOUNTED COMPUTER DEVICE

(75) Inventors: Alfred Rafi Baddour, Austin, TX (US); Misti Leigh Faykus, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 09/518,841

(22) Filed: Mar. 3, 2000

(51) Int. Cl.[7] .................................................. A47F 7/00
(52) U.S. Cl. ......................................... 211/26; 211/175
(58) Field of Search ............................ 211/26, 175, 189; 312/334.44, 334.46, 223.2; 361/725, 726, 727

(56) References Cited

U.S. PATENT DOCUMENTS

| | | | |
|---|---|---|---|
| 3,650,578 A | * 3/1972 | Del Vecchio et al. | ......... 384/18 |
| 3,776,608 A | 12/1973 | Fall et al. | |
| 3,778,120 A | * 12/1973 | Hagen et al. | ................. 384/18 |
| 3,790,233 A | 2/1974 | Polidor | |
| 3,950,040 A | 4/1976 | Fall | |
| 4,089,568 A | 5/1978 | Fall | |
| 4,200,342 A | 4/1980 | Fall | |
| 4,389,079 A | 6/1983 | Cosme | |
| 5,277,615 A | 1/1994 | Hastings et al. | |
| 5,460,441 A | * 10/1995 | Hastings et al. | ............ 312/298 |
| 5,505,533 A | 4/1996 | Kammersgard et al. | |
| 5,551,775 A | * 9/1996 | Parvin | ................... 312/334.11 |
| 5,571,256 A | 11/1996 | Good et al. | |
| 5,624,171 A | * 4/1997 | Soja et al. | ............... 312/334.8 |
| 5,671,988 A | * 9/1997 | O'Neill | ................. 312/334.44 |
| 5,833,337 A | * 11/1998 | Kofstad | .................... 312/334.5 |
| RE36,005 E | 12/1998 | Herbeck | |
| 5,890,602 A | * 4/1999 | Schmitt | ..................... 211/13.1 |
| 5,921,402 A | 7/1999 | Magenheimer | |
| 6,021,047 A | * 2/2000 | Lopez et al. | ................. 361/727 |
| 6,070,742 A | * 6/2000 | McAnally et al. | ............ 211/26 |
| 6,123,203 A | * 9/2000 | Gibbons | ...................... 211/26 |
| 6,181,549 B1 | * 1/2001 | Mills et al. | ................. 361/683 |
| 6,201,702 B1 | * 3/2001 | Schmitt | ....................... 361/725 |
| 6,230,903 B1 | * 5/2001 | Abbott | ........................ 211/26 |

\* cited by examiner

*Primary Examiner*—Gregory J. Strimbu
(74) *Attorney, Agent, or Firm*—Baker Botts L.L.P.

(57) ABSTRACT

A system and apparatus for enabling top, front and rear access to a rack mounted computer device includes a computer device mounted into a rack structure with a pair of rails attached to opposing sides of the computer device, where the rails slidingly couple with respective slide assemblies on the rack structure. The slide assemblies and the rails cooperate with each other to allow the computer device to be extended from a front opening and a rear opening of the rack structure. The slide assemblies and the rails further cooperate to lock the computer device in a position proximate to the rear opening of the rack structure.

17 Claims, 5 Drawing Sheets

SYSTEM AND APPARATUS ENABLING TOP, FRONT AND REAR ACCESS TO A RACK MOUNTED COMPUTER DEVICE

TECHNICAL FIELD

The present disclosure relates generally to rack mounted computer devices. More particularly, the present disclosure relates to a rack mount slide system enabling front, top and rear access to a rack mounted device.

BACKGROUND

An electronics rack can house a number of electronic devices made by different electronics manufacturers. Consequently, the height, width, and depth of the electronic devices to be housed in the rack preferably conform to specific standards such as the Electronics Industry Association (EIA)rack standard.

Electronics racks conforming to EIA standards have a defined vertical mounting unit increment. The retma (U) unit is one such mounting unit increment. The height of electronic devices conforming to the standard is typically sized in mounting unit increments to allow for the efficient utilization of rack space and the standardization of rack structures.

Computer systems are often mounted in electronics racks. Rack mounted computer systems enable computer devices to be installed vertically, taking up less floor space in a computer operations area. Multiple racks can be installed in a computer operations area to allow for the growth and flexibility of the devices installed. Rack structures are typically columnar with the individual devices attached to side mount slides that are attached to the rack structure. The individual devices typically slide into and out of the rack from only the rear of the rack. In this manner, the individual devices may be accessed for repairs, upgrades, reconfiguring, and connecting the device to other devices as well as other tasks.

SUMMARY

In accordance with teachings of the present disclosure, a system is described for providing top, rear, and front access to a rack mounted device.

Accordingly, one embodiment of the present disclosure provides a computer system preferably including a rack structure having a front opening, a rear opening and a pair of slide assemblies. A housing having a pair of rails attached to opposite sides thereof is also preferably included. The rails attached to the housing are preferably coupled with respective slide assemblies in the rack structure. The slide assemblies and the rails are preferably configured to cooperate with each other to allow the housing to be extended from the front opening and the rear opening of the rack structure. The slide assemblies and rails are preferably further operable to lock the housing in a position proximate the rear opening of the rack structure.

In another embodiment, the present disclosure provides a computer system preferably including a rack structure operable to maintain at least one rack mountable device. A rack mountable device having a front panel, a rear panel and a top panel is provided and preferably attached to a pair of slide assemblies coupled to the rack structure. The slide assemblies preferably cooperate to allow the rack mountable device to be extended from a front opening and a rear opening of the rack structure. A bi-directional lock is also provided. The bi-directional lock is preferably attached to at least one slide assembly and is preferably operable to lock the rack mountable device in a first locked position proximate the rear opening of the rack structure and in a second locked position proximate the front opening of the rack structure.

In yet another embodiment, the present disclosure provides a mountable computer preferably including a housing having a top panel, a rear panel and a front panel. A pair of rails are preferably attached to opposite sides of the housing and a pair of slide assemblies are preferably coupled to the respective rails. The pair of slide assemblies are preferably operable to couple the housing to a structure. The pair of slide assemblies cooperate with the rails in a preferred embodiment to allow the housing to be displaced with respect to the structure. A bi-directional lock is preferably included which is operably coupled to at least one slide assembly. The bi-directional lock is preferably operable to lock the housing in a first locked position and a second locked position.

In conventional rack mount systems, it is often preferable to service some hot-swap components, such as fan banks, located inside of a rack mounted device from the front of the rack. To do this, it is desirable for the device to slide fully out of the rack and to be presented in a stable, locked position. In this locked position, the device must still be operable to enable true hot-swap functionality. To be operable, the device must remain fully connected to power and I/O (input/output) cabling.

In another scenario, it may be preferable to service some hot-swap components from the rear of the rack structure. Full access near the rear vertical EIA rails of the rack structure as well as locking in this position are required to enable insertion or extraction of hotswap components, such as a power supply or GBIC (Gigabit Interface Converter). For a 1U device, conventional cable management commonly blocks access to all the rear-accessed hot-swap components as the cable management generally fills all of the 1U height of the rack mount envelope. An additional limitation to rear access of a 1U device is the fact that the 1U envelope is generally too small to reach more than approximately an inch therein. Even if cable management is removed, the position of the device is often too far into the rack to be reachable. The present disclosure provides a rack mount solution in a 1U envelope that offers the flexibility to service hot-swap components from the front and the rear of the rack structure while maintaining substantially full device functionality and interconnection at all times.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1–6, wherein like numbers are used to indicate like and corresponding parts.

Figures 1, 2:
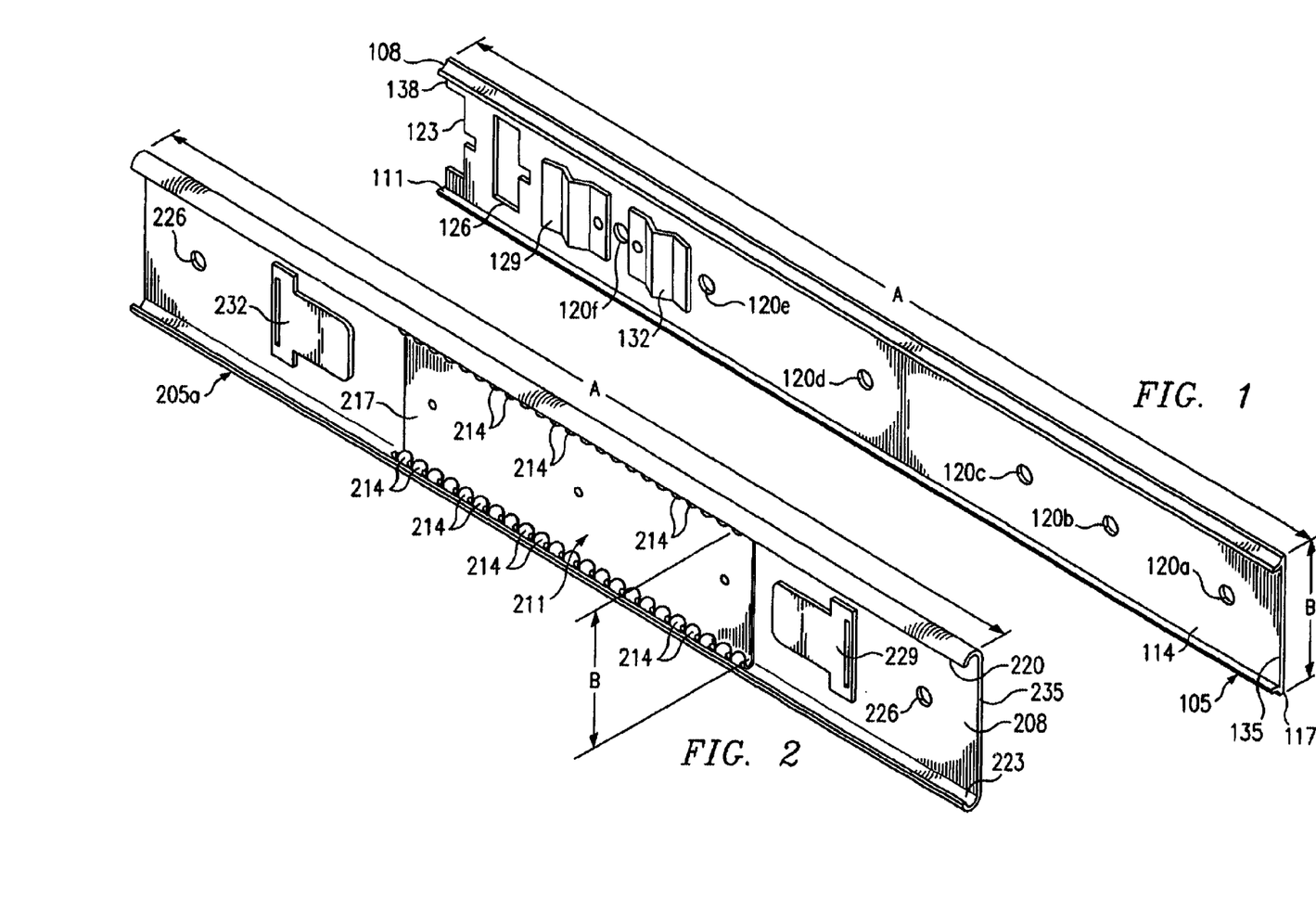
FIG. 1 is a schematic drawing showing a perspective view of a rail and lock assembly incorporating teachings of the present disclosure.
FIG. 2 is a schematic drawing showing a perspective view of a bar and bearing assembly incorporating teachings of the present disclosure.

Referring first to FIG. 1, a perspective view of a rail and lock assembly incorporating teachings of the present disclosure is shown. Rail 105 is preferably made from a rigid material capable of supporting the weight of a rack mountable device. The length of rail 105, as indicated along A, is generally equal to the distance from the front vertical rail of an EIA rack structure to the rear vertical rail of an EIA rack structure (illustrated in FIGS. 5 and 6). First race 108 and second race 111 of rail 105 are preferably generally arcuate and configured to receive a plurality of ball bearings therein. A series of apertures 120a–120f extend through rail 105 first side 114 and second side 117 enabling rail 105 to be coupled to another rail, a bar or a rack mountable device. First notch 123 and second notch 126 disposed at end 138 of rail 105 are preferably configured to receive a device displacement apparatus (not expressly illustrated). Preferably coupled to first side 114 of rail 105 are bidirectional locking components, first spring biased lock 129 and second spring biased lock 132. The bidirectional locking function of spring biased locks 129 and 132 will be described in further detail with reference to FIGS. 2–6 below.

Referring now to FIG. 2, a perspective view of a bar and bearing assembly incorporating teachings of the present disclosure is shown. Similar to rail 105, bar 205a is preferably made from a rigid material capable of supporting the weight of a rack mountable device. In a preferred embodiment of the present disclosure, the length of bar 205a, indicated along A, is generally equal to the distance from the front vertical rail to the rear vertical rail of an EIA rack structure (not illustrated).

Operably coupled to first surface 208 of bar 205a is bearing assembly 211. Bearing assembly 211 is preferably constructed from a plurality of ball bearings 214 attached to a bearing frame 217. Ball bearings 214 are preferably sized such that ball bearings 214 travel easily in first race 220 and second race 223 of bar 205a as well as in first race 108 and second race 111 of rail 105, as illustrated in FIG. 1. The distance between ball bearings 214 maintained in first race 220 and the ball bearings maintained in second race 223 by bearing frame 217 is preferably equal to the distance along line B of FIG. 1 and as indicated at line B of FIG. 2.

The distance between first race 108 and second race 111 approximates the distance between ball bearings 214 in first race 220 and second race 223 to allow rail 105 and bar 205a, to be coupled together, and to subsequently be telescopically moved with respect to one another. Ball bearings 214 are preferably capable of easy travelling in first and second races 220 and 223 of bar 205a and first and second races 108 and 111 of rail 105 in FIG. 1. Bar 205a is further configured with a series of apertures 226 enabling bar 205a to be coupled to another bar, a rail or a rack mountable device.

To enable bar 205a and rail 105 to be locked in a position relative to one another, a series of spring biased lock engagement/disengagement tabs 229 and 232 are preferably included on surface 208 of bar 205a. Spring biased lock engagement/disengagement tabs 229 and 232 are configured to engage spring biased locks 129 and 132 such that bar 205a and rail 105 are locked in a preferred position relative to one another. As bar 205a and rail 105 are moved relative to one another, either spring biased lock engagement/disengagement tab 229 or spring biased lock engagement/disengagement tab 232 will engage either spring biased lock 129 or spring biased lock 132, depending on the direction of movement. Once engaged, the spring biased lock engagement/disengagement tab 229 or 232 can be depressed, using a thumb release accessible from second side 235 of bar 205a, to disengage spring biased lock 129 or 132.

Figure 3:
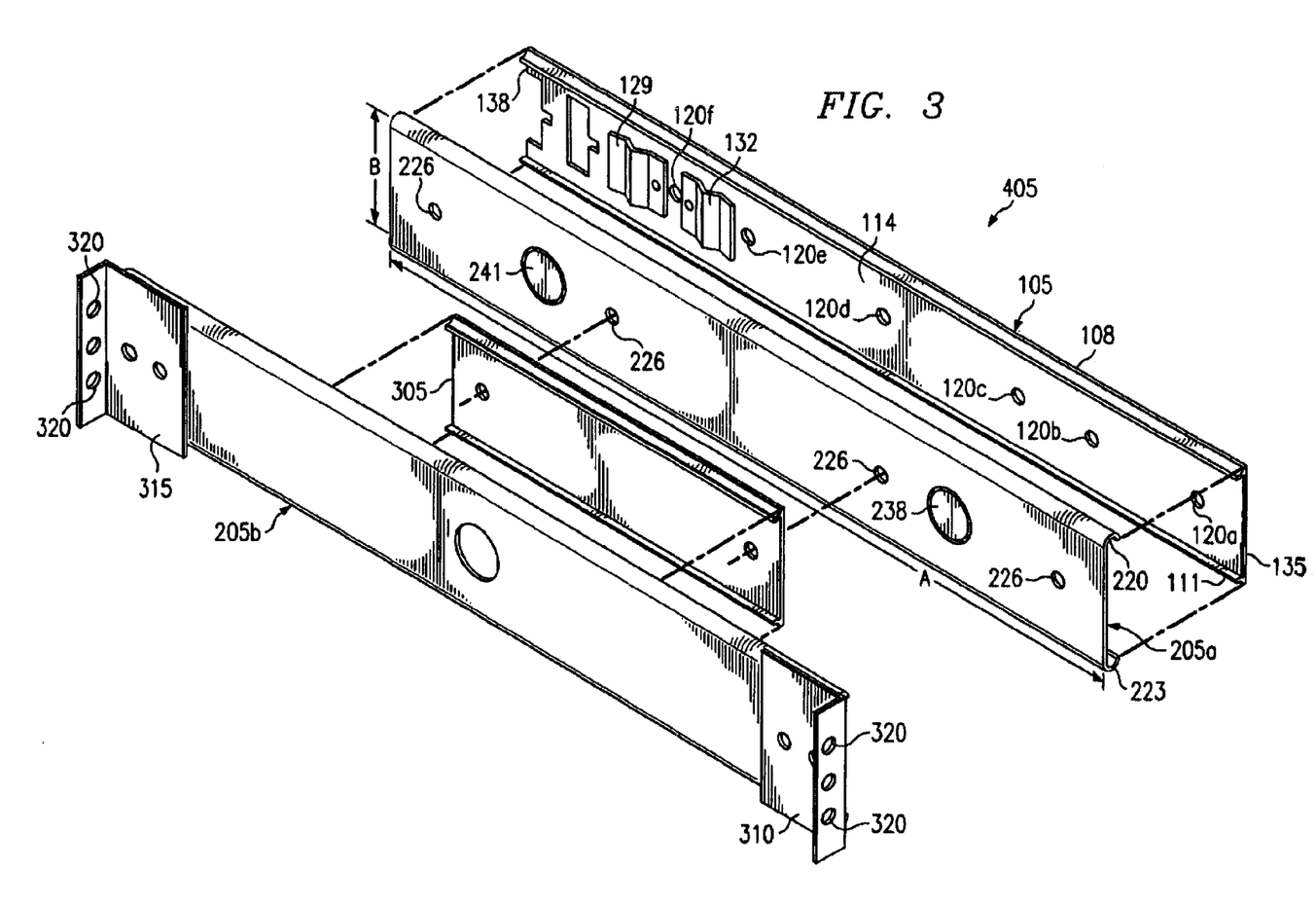
FIG. 3 is a schematic drawing showing a exploded perspective view of a preferred assembly of the components of FIGS. 1 and 2 according to one embodiment of the present disclosure.

Referring now to FIG. 3, an exploded perspective view of a preferred assembly of the components of FIGS. 1 and 2 according to one embodiment of the present disclosure is shown. As illustrated in FIG. 3, the slide assembly 405 of the present disclosure is preferably constructed by mating rail 105 with bar 205. Rail 105 is preferably mated with bar 205a by engaging first race 108 and race 111 with ball bearings 214 included in bearing assembly 211. In this preferred orientation, first surface 114 of rail 105 is positioned to face surface 208 of bar 205a.

Once mated, ball bearings 214 of bearing assembly 211 slidably engage first race 108 and second race 111 of rail 105 allowing rail 105 to be moved linearly with respect to and along length A of bar 205a. As bar 205a and rail 105 slide with respect to one another, spring biased locks 129 and 132 coupled with spring biased lock engagement/disengagement tabs 229 and 232 form a bidirectional lock enabling rail 105 and bar 205a to be locked in a plurality of positions. For example, as bar 205a is moved towards end 135 of rail 105, spring biased lock 132 will engage spring biased lock engagement/disengagement tab 229 of bar 205a, locking rail 105 and bar 205a in a fixed position relative to one another.

Bar 205a can be released from engagement with rail 105 by depressing thumb release 241 attached to spring biased lock engagement/disengagement tab 229. Depressing thumb release 241 causes spring biased lock 132 to be disengaged from spring biased lock engagement/disengagement tab 229. Similarly, by moving bar 205a towards end 138 of rail 105, spring biased lock 129 engages spring biased engagement/disengagement tab 232 such that bar 205a is locked in position relative to rail 105. Thumb release 238, functioning in much the same manner as thumb release 241, may then be employed to disengage spring biased lock 129 from spring biased engagement/disengagement tab 232 subsequently allowing freedom of motion of bar 205a with respect to rail 105.

The slide assembly of the present disclosure preferably includes rail portion 305 and bar 205b. Rail portion 305 is operably coupled to bar 205a using respective apertures 226 on bar 205a and a mechanical fastening means such as nuts and bolts, screws, rivets or other sufficient mechanical fastening means. Rail portion 305 is configured generally the same as the section of rail 105 between spring biased lock 132 and end 135. Rail portion 305 is used to operably couple bar 205b to bar 205a, completing a preferred embodiment of a slide assembly incorporating teachings of the present disclosure.

Bar 205b is preferably configured generally the same as bar 205a. Attached to each end of bar 205b are rack mount brackets 310 and 315. Rack mount brackets 310 and 315 are employed by the slide assembly of a preferred embodiment to fixedly position bar 205b in a rack structure. Fixedly positioning bar 205b in a rack structure allows bar 205a and rail 105 to be linearly displaced relative to the rack structure and bar 205b. Apertures 320 of rack mount brackets 310 and 315 are preferably used to couple bar 205b to corresponding apertures in the vertical rails of an EIA type rack structure.

Figure 4:
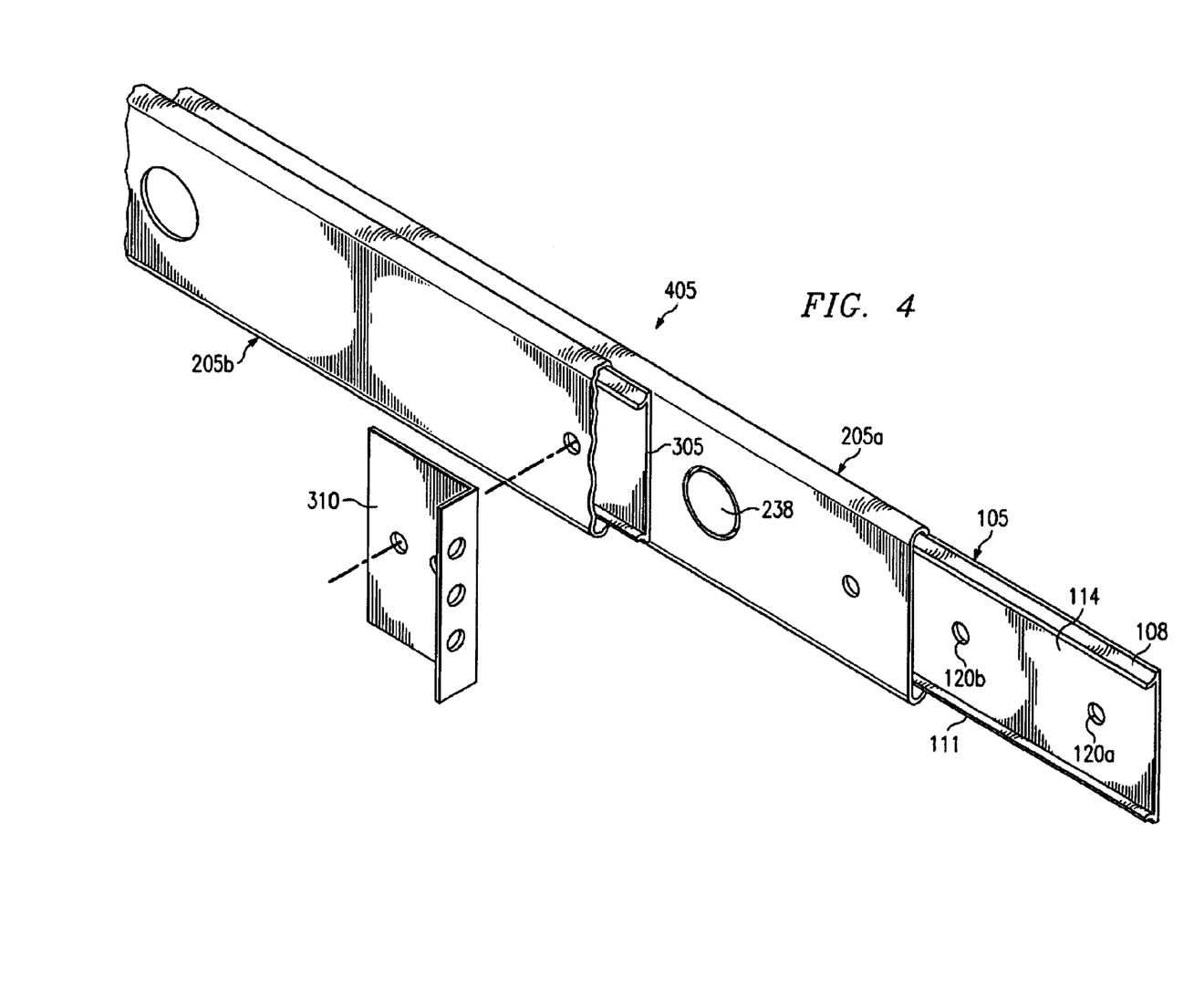
FIG. 4 is a schematic drawing showing a perspective view, with portions broken away, of a slide assembly incorporating teachings of the present disclosure.

Referring now to FIG. 4, a perspective view, with portions cut away, of a slide assembly incorporating teachings of the present disclosure is shown. Slide assembly 405 is a preferred result of coupling rail 105, bar 205a, rail portion 305 and bar 205b in the manner illustrated in FIG. 3. As illustrated, rail 105 and bar 205a are capable of moving freely with respect to bar 205b. This linear, telescoping motion is enabled by using a bearing assembly 211 to couple rail portion 305 to bar 205b and a bearing assembly 211 to couple rail 105 to bar 205a. Rail portion 305, being fixedly attached to bar 205a, thereby allows bar 205a to be moved linearly with respect to bar 205b once mounted in a rack structure.

Figure 5:
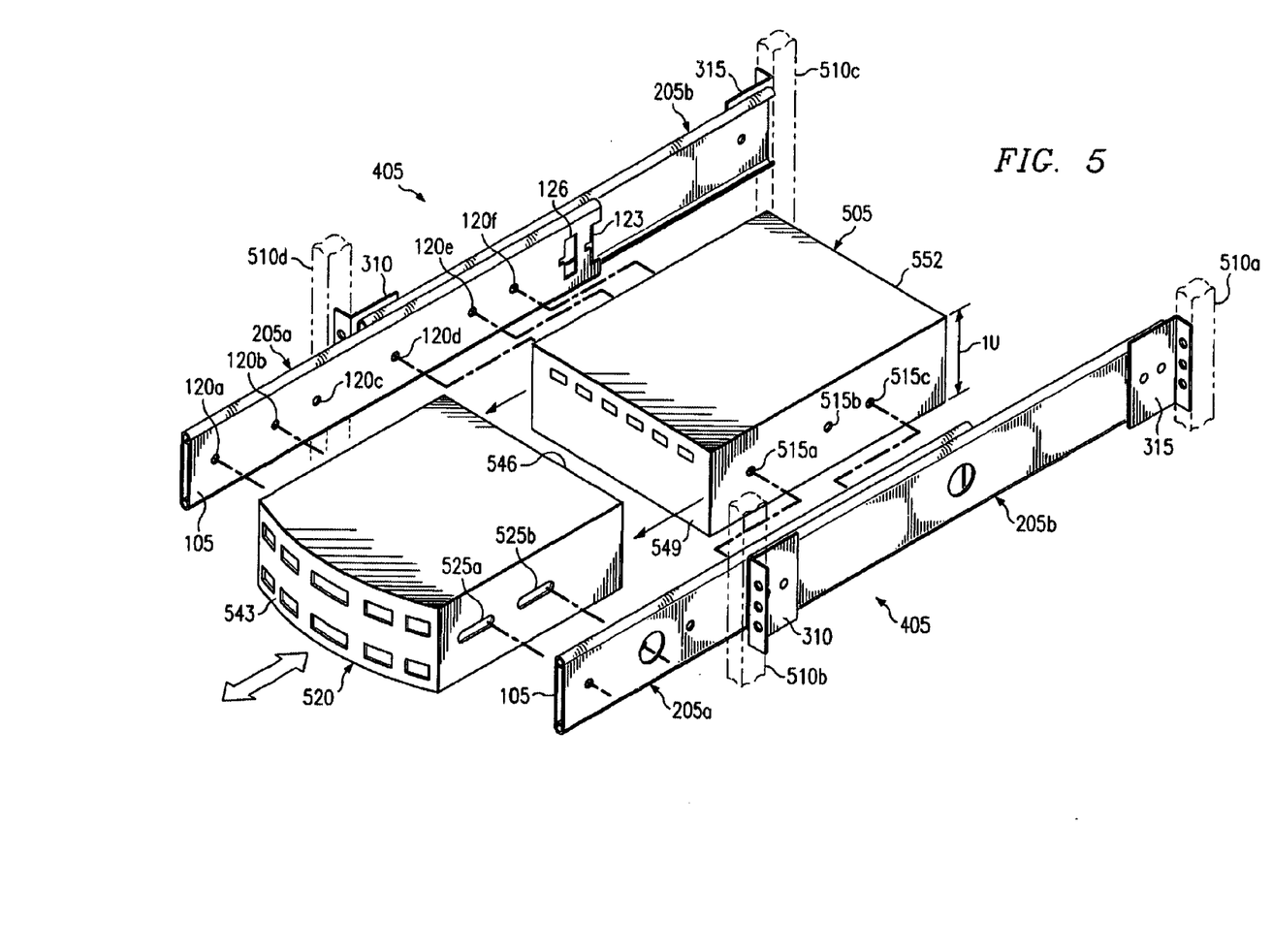
FIG. 5 is a schematic drawing showing a exploded perspective view of a 1U device coupled to a pair of slide assemblies incorporating teachings of the present disclosure.

Referring now to FIG. 5, an exploded perspective view of a 1U device coupled to a pair of slide assemblies incorporating teachings of the present disclosure is shown. As illustrated, the present disclosure describes a slide assembly 405 for use with rack mountable computer devices. FIG. 5 illustrates the teachings of the present disclosure employed with device 505 which is 1U in height. Dashed lines 510a–510d represent the four vertical rails of an EIA rack structure.

Slide assemblies 405 are shown attached to vertical rails 510a–510d utilizing rack mount brackets 310 and 315. Device 505 is preferably coupled to rail 105 of each slide assembly 405 using mechanical fasteners passed through apertures 120d and 120e on rail 105 of each slide assembly 405 and corresponding apertures 515a and 515c on either side of device 505. Also coupled to rail 105 of each slide assembly 405 is air duct 520. Air duct 520 is coupled to rail 105 using duct slide apertures 525a and 525b on either side of air duct 520.

Figure 6:
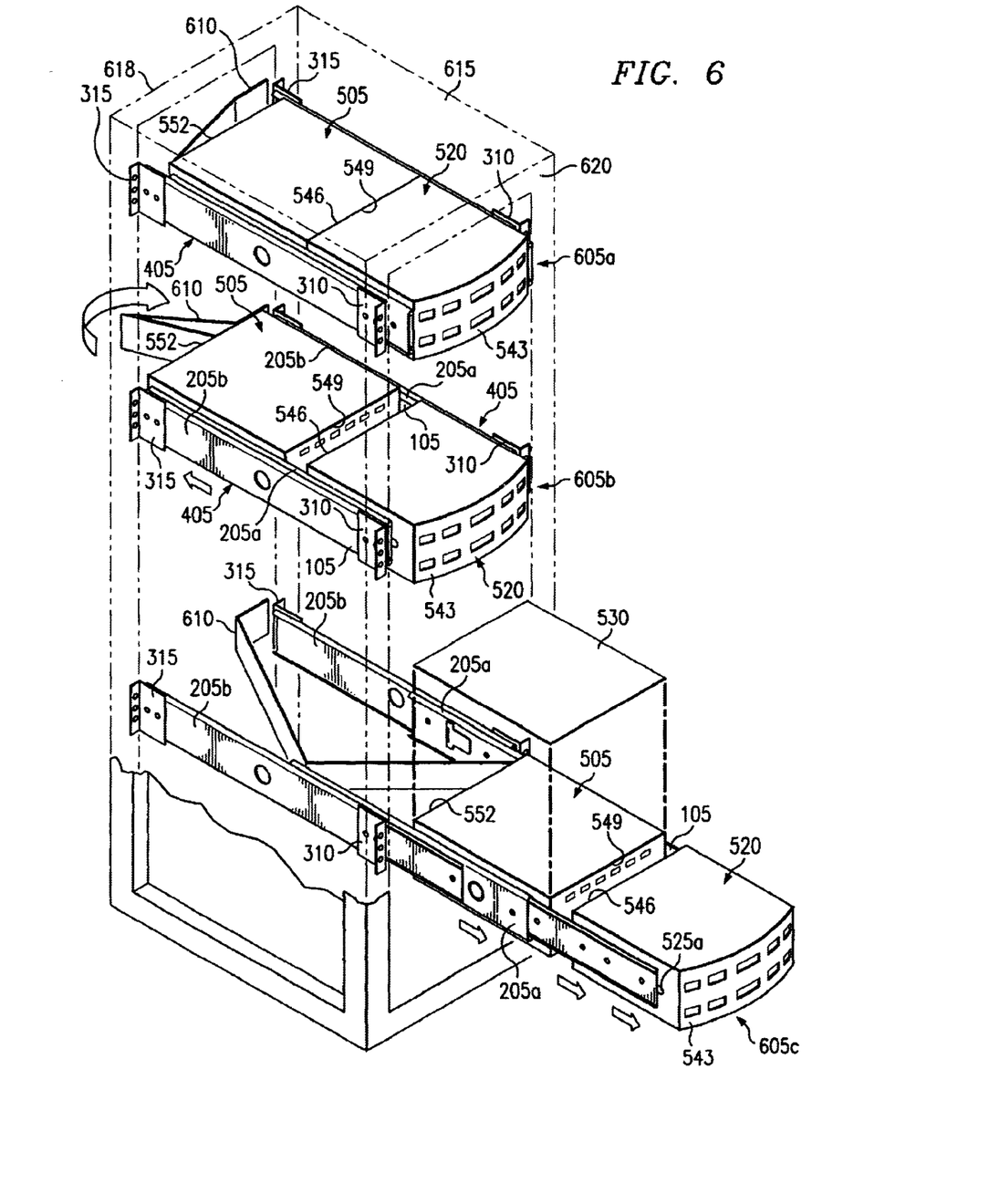
FIG. 6 is a schematic drawing showing a perspective view, with portions broken away, of a rack structure incorporating teachings of the present disclosure.

Referring now to FIG. 6, a perspective view of a rack structure incorporating teachings of the present disclosure is shown. Illustrated in FIG. 6 are three preferred positions for device 505 mounted onto a pair of slide assemblies 405 according to a preferred embodiment of the present disclosure. At 605a, 1U device 505 and air duct 520 are illustrated in a standard operating position. As illustrated at 605a, cable management arm 610, at rear 618 of rack structure 615, is shown detached. Normally, cable management arm 610 is fixedly coupled to rack structure 615 proximate the attachment point of rack mount bracket 315 at rear 618 of rack structure 615. As shown at 605a, front 543 of air duct 520 is generally flush with front 620 of rack structure 615. In addition, rear 546 of air duct 520 is shown flush with front panel 549 of device 505 in the operating position illustrated at 605a.

As shown at 605b, a rearward locked, position of slide assembly 405 and device 505 is shown. As illustrated at 605b, device 505 is displaced from front 620 of rack structure 615 such that rear panel 552 of device 505 is generally flush with rear 618 of rack structure 615. As shown, positioning device 505 at rear 618 of rack structure 615 may require cable management arm 610 to be detached and displaced from rack structure 615 to allow access to the components located thereon. In the position illustrated at 605b, air duct 520 has remained in its original position, generally flush with front 620 of rack 615. In the rearward locked position illustrated in FIG. 6, device 505 may be returned to the operating position illustrated at 605a by depressing thumb release 241, illustrated in FIG. 2, such that spring biased lock 129, illustrated in FIG. 1, is disengaged from spring biased lock engagement/disengagement tab 232, illustrated in FIG. 2. Alternatively, device 505 may be returned to the operating position illustrated at 605a by depressing spring biased lock 129 directly, omitting thumb release 241, such that spring biased lock 129 is disengaged from spring biased lock engagement/disengagement tab 232.

Illustrated at 605c, a frontal extension of slide assembly 405 and device 505 is shown. At 605c, both air duct 520 and device 505 are extended beyond front 620 of rack structure 615. In this position, slide assembly 405 is locked in place as spring biased lock 132 sufficiently engages spring biased lock engagement/disengagement tab 229, illustrated in FIGS. 1 and 2 respectively. From this locked position, it is possible for a technician or other person to remove top panel 530 from device 505 for the maintenance or performance of other services to components internal to the 1U housing of device, 505. Cable management arm 610 is shown generally fully extended at 605c. Full extension of cable management arm 610 enables any operating cables, such as I/O or power, to remain attached to device 505 in this frontal extended position. Air duct 520 is also shown extended away from front panel 549 of device 505. Air duct 520 is allowed to move away from front panel 549 of device 505 using duct slide apertures 525a and 525b. Similar to the locked position illustrated at 605b, air duct 520 and device 505 can be returned to the operating position illustrated at 605a by depressing thumb release 238, illustrated in FIG. 2, such that spring biased lock 132 is disengaged from spring biased lock engagement/disengagement tab 229.

Although the disclosed embodiments have been described in some detail, it should be understood that various changes, substitutions and alterations can be made to the embodiments without departing from their spirit and scope. For example, although the slide assembly of the present disclosure has been described and employed herein with a 1U device, rack mountable devices of other heights may also incorporate the teachings of the present disclosure. In addition, it is also possible to have more than two locking positions for the slide assembly described herein.

What is claimed is:

1. A computer system comprising:
   a rack structure having a pair of slide assemblies;
   the rack structure having a front opening and a rear opening;
   a computer device having a pair of rails each attached to an opposite side thereof and the rails coupled with the slide assemblies;
   the slide assemblies and the rails cooperating with each other such that the computer device is operable to be displaced with respect to the front opening of the rack structure and the rear opening of the rack structure;
   the slide assemblies and rails operable to lock the computer device for preventing movement of the device relative to the rack structure in a position extended from the rear opening of the rack structure;
   the slide assemblies and rails operable to lock the computer device for preventing movement of the device relative to the rack structure in a position extended from the front opening of the rack structure;
   an air duct coupled with the rails and disposed adjacent to the computer device; and
   the air duct operable to move relative to the computer device to allow access to a front panel and a top panel of the computer device.

2. The computer system of claim 1 further comprising a bi-directional lock operable to lock the computer device in a plurality of positions relative to the rack structure, the plurality of positions including the position extended from the rear opening of the rack structure and the position extended from the front opening of the rack structure.

3. The computer system of claim 1 wherein the computer device comprises a 1U housing.

4. The computer system of claim 1 wherein the slide assemblies and rails are operable for locking the computer device in a position relative to the rack structure with a rear panel of the computer device generally flush with the rear opening of the rack structure.

5. A computer system comprising:
a rack structure operable to support at least one rack mountable device;
the at least one rack mountable device having a front panel, a rear panel and a top panel;
a pair of slide assemblies operably coupling the at least one rack mountable device to the rack structure;
the slide assemblies cooperating to allow the at least one rack mountable device to be displaced with respect to a front opening and a rear opening of the rack structure;
a bi-directional lock operably coupled to at least one of the slide assemblies;
the bi-directional lock operable to lock the at least one rack mountable device in a first locked position relative to the rack structure extended from the rear opening of the rack structure and a second locked position relative to the rack structure extended from the front opening of the rack structure;
an air duct operably coupled to the pair of slide assemblies and disposed adjacent the rack mountable device;
the air duct operable to provide air flow to the rack mountable device; and
the air duct operable to move relative to the rack mountable device allowing access to the front panel of the rack mountable device.

6. The computer system of claim 5 further comprising the at least one rack mountable device disposed in a 1U housing.

7. The computer system of claim 5 further comprising the at least one of the slide assemblies and the bi-directional lock cooperating with each other to allow the rack mountable device to be maintained in a generally flush relation with the rear opening of the rack structure in the first locked position.

8. The computer system of claim 5 further comprising the at least one of the slide assemblies and the bi-directional lock cooperating with each other to allow the rack mountable device to be maintained proximate the front opening of the rack structure in the second locked position such that access to the front panel and the top panel of the rack mountable device is provided.

9. The computer system of claim 5 further comprising a bi-directional lock operably coupled to the other of the slide assemblies.

10. A mountable computer system comprising:
a computer device having a top panel, a rear panel and a front panel;
a pair of rails each attached to an opposite side of the computer device;
a pair of slide assemblies operably coupled to the pair of rails;
the pair of slide assemblies operable to couple the computer device to a structure having a front and rear;
the pair of slide assemblies cooperating with the rails to allow the computer device to be displaced with respect to the front and rear of the structure;
a bi-directional lock operably coupled to at least one of the slide assemblies; and
the bi-directional lock operable to lock the computer device relative to the structure in a first locked position extending from a rear opening of the structure and a second locked position extending from a front opening of the structure;
an air duct coupled with the pair of rails and disposed adjacent the computer device; and
the air duct operable to move relative to the computer device to allow access to the front panel and the top panel of the computer device.

11. The mountable computer system of claim 10 wherein the structure comprises a rack structure.

12. The mountable computer system of claim 10 further comprising the first locked position of the computer device orienting the rear panel of the computer device in a generally flush relation to the rear opening of the structure.

13. The mountable computer system of claim 10 further comprising the second locked position of the computer device orienting the computer device such that access to the top panel and the front panel of the computer device from the front opening of the structure is provided.

14. The mountable computer system of claim 10 further comprising the computer device occupying 1U of vertical space in the structure.

15. A computer system comprising:
a rack structure having a pair of slide assemblies;
the rack structure having a front opening and a rear opening;
a computer device housing having a pair of rails attached to opposite sides thereof and the rails coupled with the slide assemblies;
the slide assemblies and the rails cooperating with each other to allow the computer device housing to be displaced with respect to the front opening and the rear opening of the rack structure;
the slide assemblies and rails operable to lock the computer device in a position proximate the rear opening of the rack structure;
an air duct coupled with the rails and disposed adjacent to the computer device housing; and
the air duct operable to move relative to the housing to allow access to a front panel and a top panel of the computer device housing.

16. A computer system comprising:
a rack structure operable to support at least one rack mountable device;
the at least one rack mountable device having a front panel, a rear panel and a top panel;
a pair of slide assemblies operably coupling the at least one rack mountable device to the rack structure;
the slide assemblies cooperating to allow the at least one rack mountable device to be displaced with respect to a front opening and a rear opening of the rack structure;
a bi-directional lock operably coupled to at least one of the slide assemblies;
the bi-directional lock operable to lock the at least one rack mountable device in a first locked position proximate the rear opening of the rack structure and a second locked position proximate the front opening of the rack structure;

an air duct operably coupled to the pair of slide assemblies and disposed adjacent the at least one rack mountable device;

the air duct operable to increase air flow to the at least one rack mountable device; and the air duct further operable to move relative to the at least one rack mountable device allowing access to the front panel of the rack mountable device.

17. A mountable computer comprising:

a computer device having a top panel, a rear panel and a front panel;

a pair of rails attached to opposite sides of the computer device;

a pair of slide assemblies operably coupled to the rails;

the pair of slide assemblies operable to couple the computer device to a structure having a front and rear;

the pair of slide assemblies cooperating with the rails to allow the computer device to be displaced with respect to the front and rear of the structure;

a bi-directional lock operably coupled to at least one of the slide assemblies;

the bi-directional lock operable to lock the computer device in a first locked position and a second locked position;

an air duct coupled with the pair of rails and disposed adjacent the computer device; and the air duct operable to move relative to the computer device to allow access to the front panel and the top panel of the computer device.

* * * * *